United States Patent
Chen et al.

[11] Patent Number: 5,867,429
[45] Date of Patent: Feb. 2, 1999

[54] HIGH DENSITY NON-VOLATILE FLASH MEMORY WITHOUT ADVERSE EFFECTS OF ELECTRIC FIELD COUPLING BETWEEN ADJACENT FLOATING GATES

[75] Inventors: Jian Chen, San Jose; Yupin Fong, Fremont, both of Calif.

[73] Assignee: SanDisk Corporation, Sunnyvale, Calif.

[21] Appl. No.: 974,276

[22] Filed: Nov. 19, 1997

[51] Int. Cl.$^6$ .................................................. G11C 16/04
[52] U.S. Cl. ............................... 365/185.33; 365/185.21; 365/185.26
[58] Field of Search ......................... 365/185.33, 185.21, 365/185.26

[56] References Cited

U.S. PATENT DOCUMENTS

| | | | |
|---|---|---|---|
| 4,417,264 | 11/1983 | Angle | 365/185.14 |
| 4,558,339 | 12/1985 | Angle | 365/185.18 |
| 4,942,450 | 7/1990 | Iwashita | 365/185.09 |
| 4,989,054 | 1/1991 | Arima et al. | 257/316 |
| 5,041,886 | 8/1991 | Lee | 365/185.33 |
| 5,043,940 | 8/1991 | Harari | 365/185.33 |
| 5,095,344 | 3/1992 | Harari | 365/185.33 |
| 5,100,818 | 3/1992 | Arima et al. | 438/265 |
| 5,120,671 | 6/1992 | Tang et al. | 438/257 |
| 5,172,338 | 12/1992 | Mehrotra et al. | 365/185.33 |
| 5,297,148 | 3/1994 | Harari et al. | 365/185.33 |
| 5,430,859 | 7/1995 | Norman et al. | 365/185.33 |
| 5,566,106 | 10/1996 | Bergemont | 365/186.33 |
| 5,640,032 | 6/1997 | Tomioka | 257/316 |

FOREIGN PATENT DOCUMENTS

| | | |
|---|---|---|
| 57-134975 | 8/1982 | Japan . |
| 07202034 | 8/1995 | Japan . |
| 07202171 | 8/1995 | Japan . |

OTHER PUBLICATIONS

Bohr, M., "Interconnect Scaling –The Real Limiter to High Performance ULSI," *IEDM Technical Digest*, pp. 241–244, (1995).

Ahn, D.H., et al., "A Highly Practical Modified LOCOS Isolation Technology for the 256 Mbt DRAMA," *IEDM Technical Digest*, pp. 679–682 (1994).

Igarashi, H., et al., "Manufacturable and Reliable Fluorine–doped low–k Interlayer Dielectric Process for High Performance Logic LSI," *1996 Symposium on VLSI Technology Digest of Technical Papers*, pp. 84–85.

Anand, M.B., et al., NURA: A Feasible, Gas–Dielectric Interconnect Process, *1996 Symposium on VLSI Technology Digest of Technical Papers*, pp. 82–83.

List, R.S., et al., "Integration of Ultra–Low–k Xerogel Gapfill Dielectric for High Performance Sub–0.18μm Interconnects," *1997 Symposium on VLSI Technology Digest of Technical Papers*, pp. 77–78.

Zhao, B., et al., "Reliablity and Electrical Properties of New Low Dielectric Constant Interlevel Dielectrics for High Performance ULSI Interconnect," *IEEE*, pp. 156–163 (1996).

Choi, J.D., et al., "A Novel Booster Plate Technology in High Density NAND Flash Memories for Voltage Scaling––Down and Zero Program Disturbance," *1996 Symposium on VLSI Technology Diges of Technical Papers*, pp. 238–239.

Aritome, S., et al., "A 0.67μm$^2$ Self–Aligned Shallow Trench Islation Cell (SA–STI CELL) for 3V–only 256Mbit NAND EEPROMs," *IEDM Technical Diges*, pp. 61–64 (1994).

*Primary Examiner*—David Nelms
*Assistant Examiner*—Trong Phan
*Attorney, Agent, or Firm*—Majestic, Parsons, Siebert & Hsue

[57] ABSTRACT

Electric field coupling between floating gates of a high density flash EEPROM cell array has been found to produce errors in reading the states of the cells, particularly when being operated with more than two storage states per cell. The effect of this coupling is overcome by placing a conductive shield or insulating material with a low dielectric constant between adjacent floating gates, and/or by compensating for the coupling when reading the states of the cells.

23 Claims, 6 Drawing Sheets

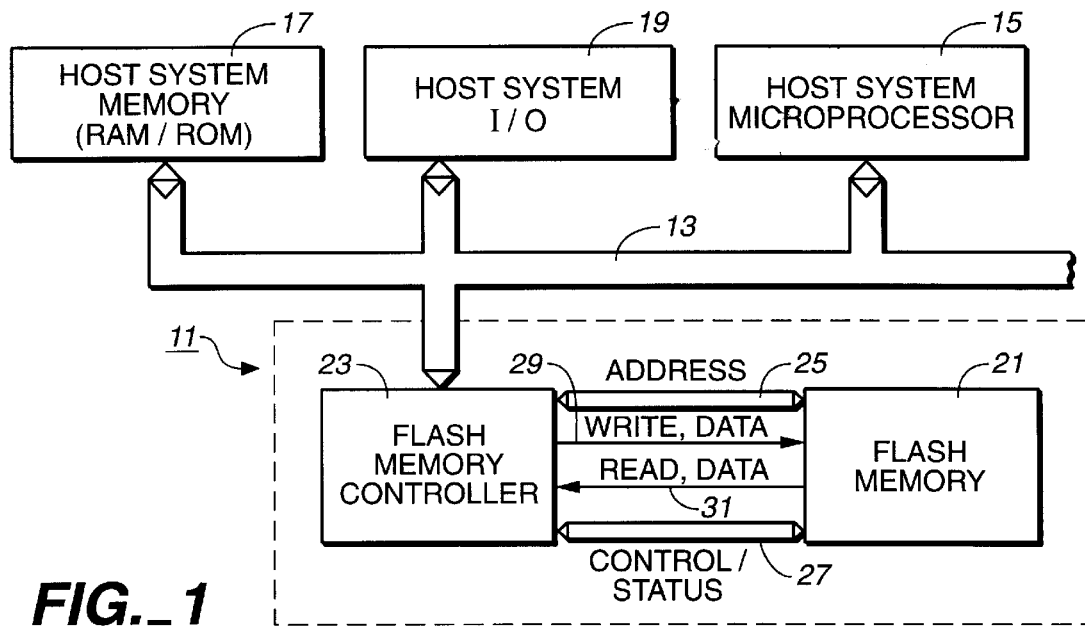
FIG._1
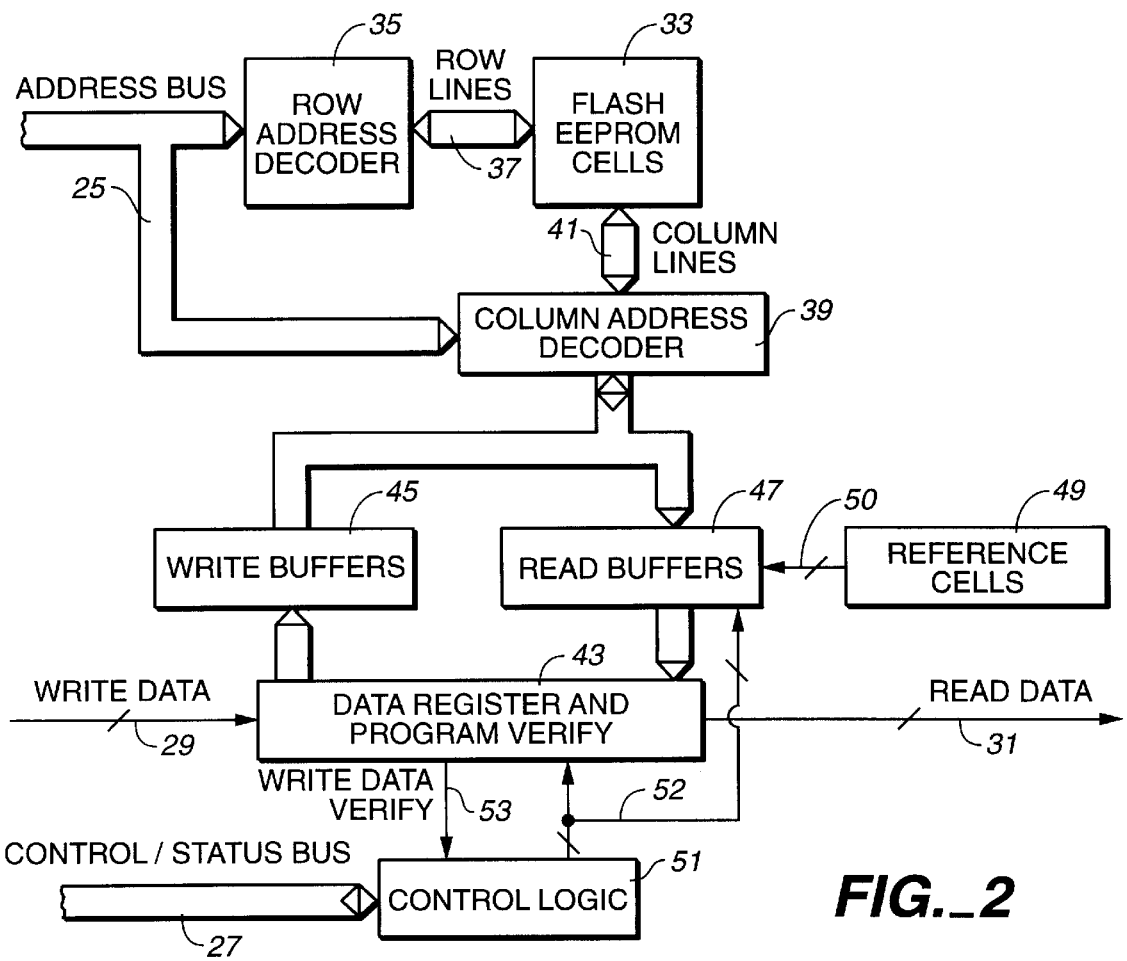
FIG._2

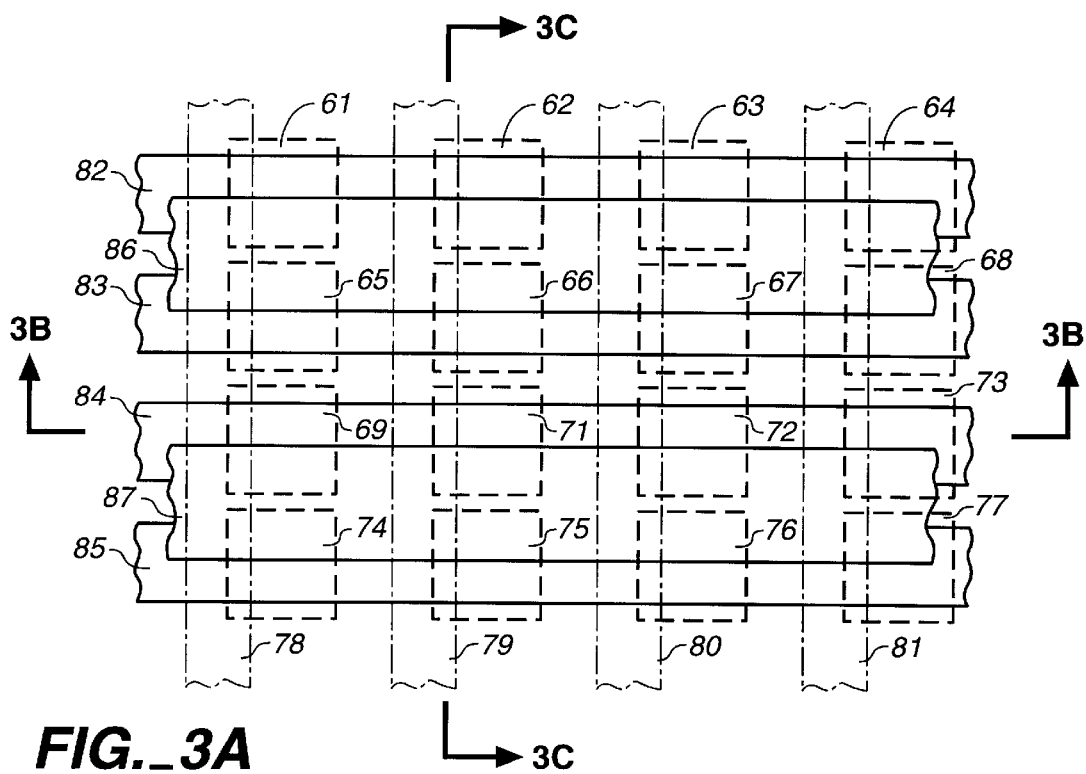
FIG._3A
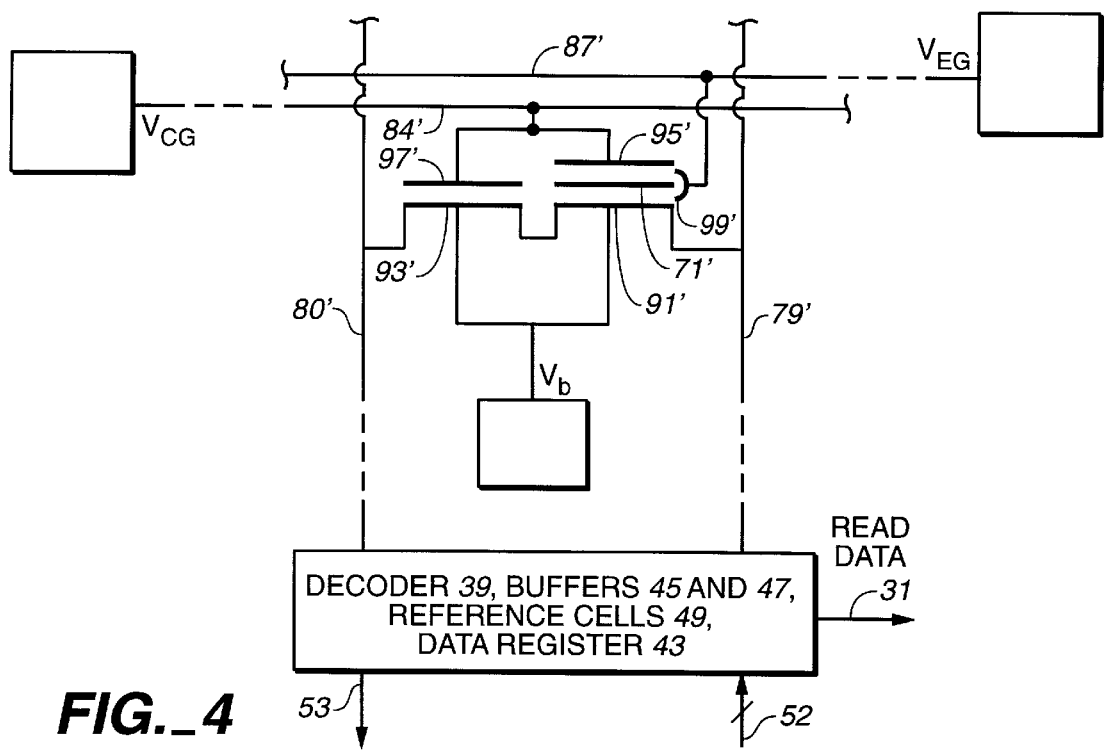
FIG._4

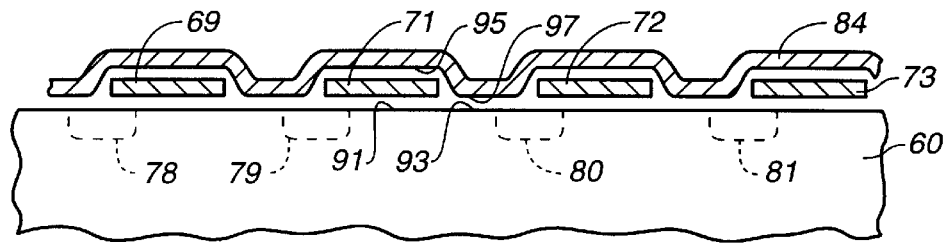
FIG._3B
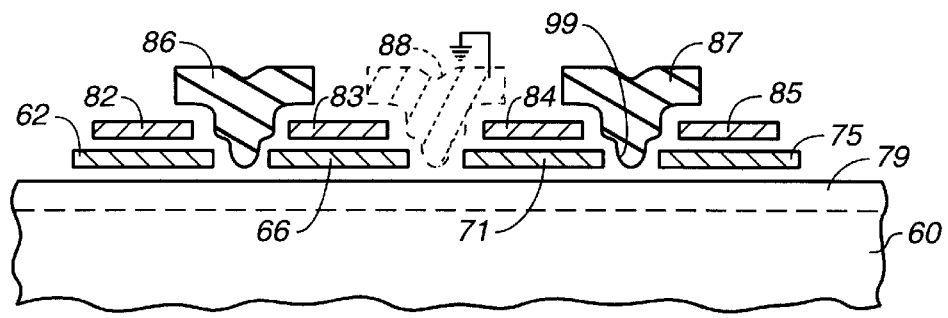
FIG._3C
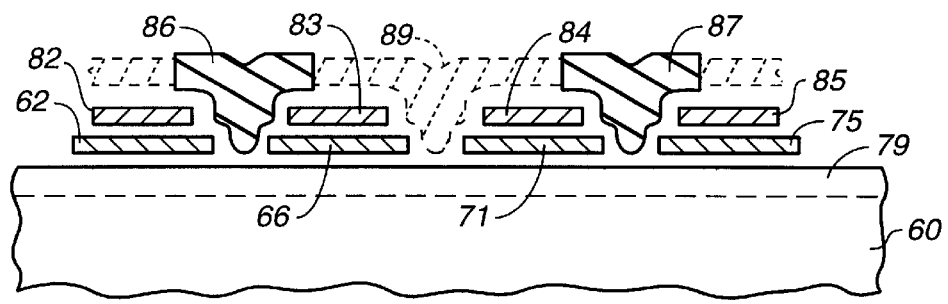
FIG._3D
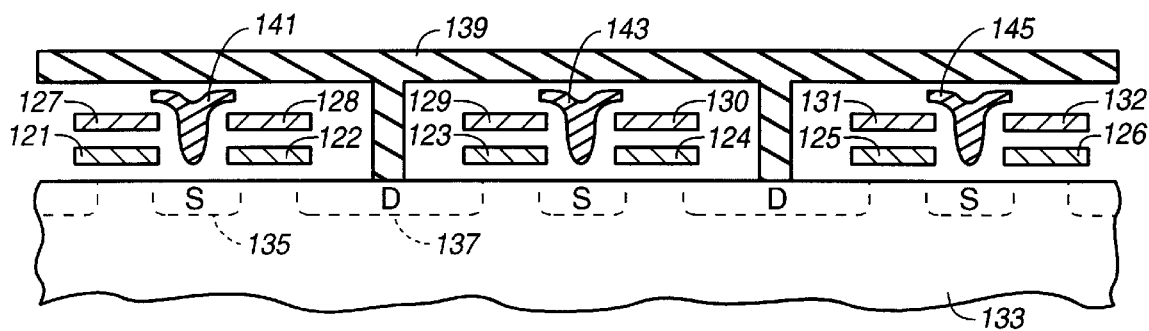
FIG._7

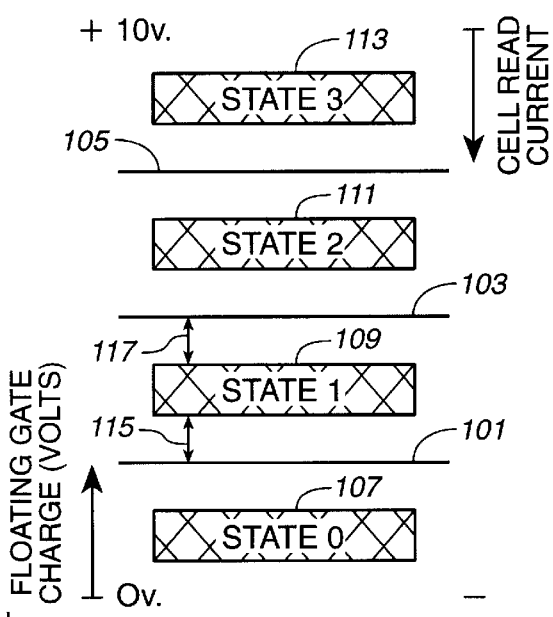
FIG._5
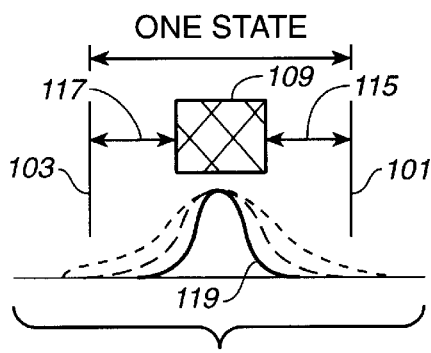
FIG._6
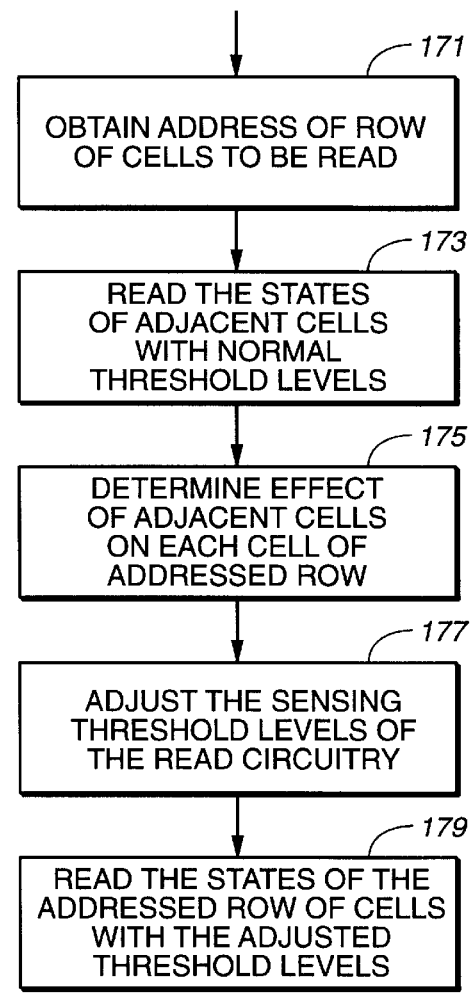
FIG._9
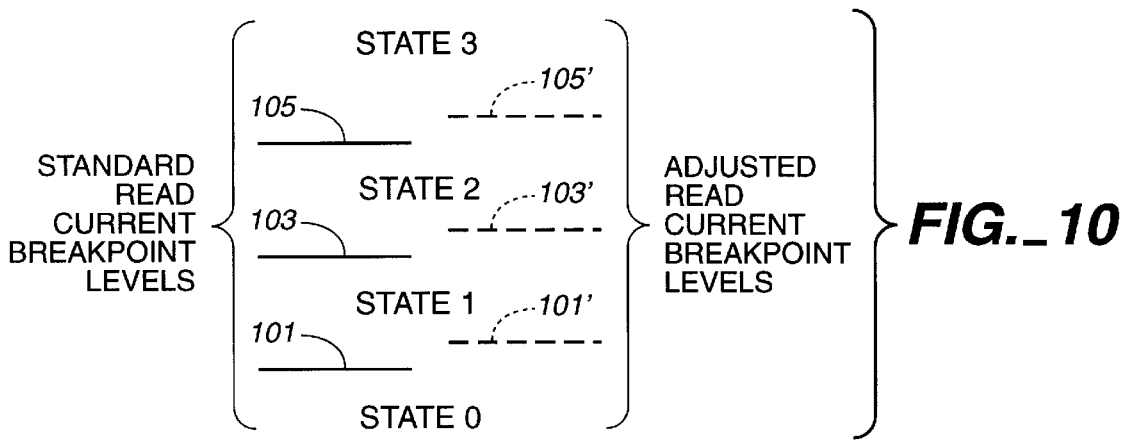
FIG._10

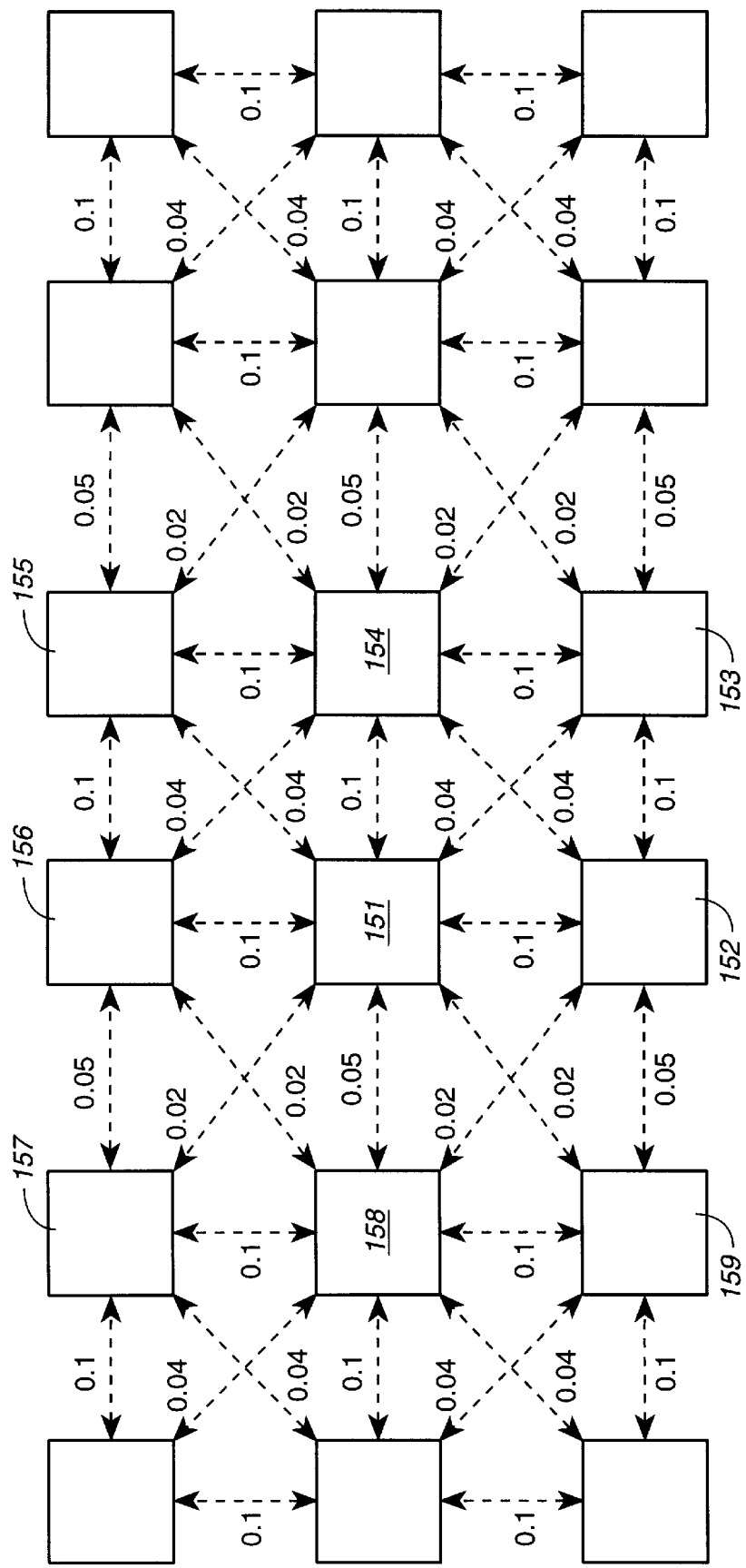
FIG._8A

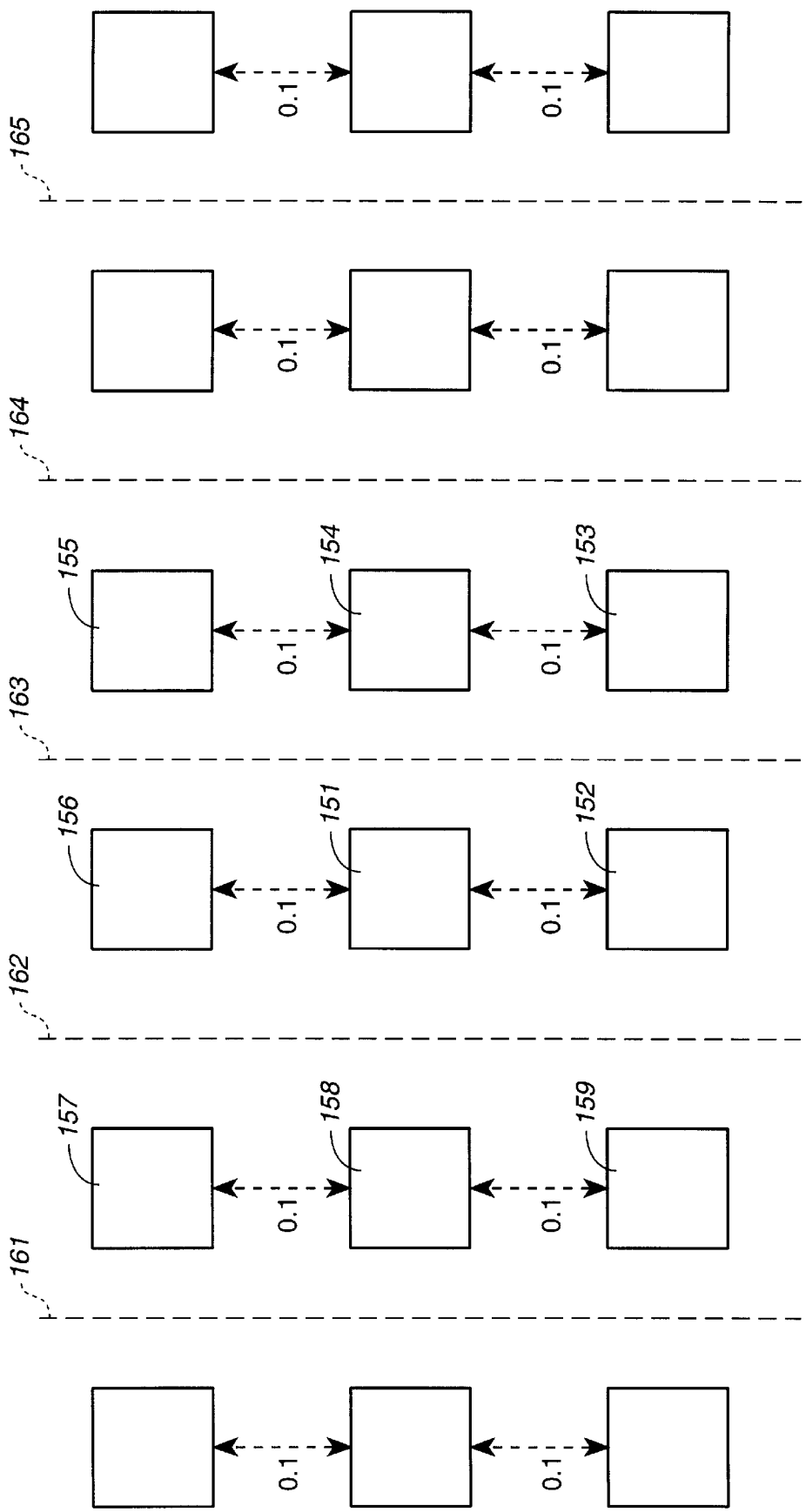
FIG._8B

HIGH DENSITY NON-VOLATILE FLASH MEMORY WITHOUT ADVERSE EFFECTS OF ELECTRIC FIELD COUPLING BETWEEN ADJACENT FLOATING GATES

BACKGROUND OF THE INVENTION

This invention relates generally to flash electrically erasable and programmable read only memories (EEPROMS), and, more specifically, to such memories with a very high density of cells, particularly when operated with more than two threshold states (termed "multi-state" or "multi-level" operation) to store more than one bit of data in each cell.

Most existing commercial flash EEPROM products operate each memory cell with two ranges of threshold voltages, one above and the other below a breakpoint level, thereby defining two programmed states. One bit of data is thus stored in each cell, a 0 when programmed into one state and a 1 when programmed into its other state. A chunk of a given number of bits of data is programmed at one time into an equal number of cells. The state of each cell is monitored during programming so that application of programming voltages stops when the threshold level an individual cell is verified to have moved within the range that represents the value of the bit of data being stored in the cell.

In order to increase the amount of data stored in a flash EEPROM system having a certain number of storage cells, the individual cells are operated with more than two threshold level states. Preferably, two or more bits of data are stored in each cell by operating the individual cells with four or more programmable states. Three threshold breakpoint levels are necessary to define four different threshold states. Such a system is described in U.S. Pat. Nos. 5,043,940 and 5,172,338, which are being incorporated herein by this reference. In multi-state operation, an available operating voltage range of the individual cells is divided into an increased number of states. The use of eight or more states, resulting in storing three or more bits of data per cell, is contemplated. The voltage range of each state necessarily becomes smaller as the number of states is increased. This leaves less margin within each state to accommodate any error that might occur during operation of the memory system.

One type of error is termed a "disturb," wherein electrons are unintentionally added to or taken away from a floating gate during operation of the memory. One source of a disturb is the presence of a leaky oxide dielectric positioned between the floating gate and another conductive gate of a cell. The charge level programmed onto a floating gate of a cell changes when such a leaky oxide is present, thus leading to the possibility that the state of the cell will be incorrectly read if the change in charge has been large enough. Since few to no errors can be tolerated in a mass digital data storage system, a sufficient margin for this error is provided by making the voltage range allocated to each state sufficient to include an expanded range of voltages that can occur as the result of such disturbs. This necessarily limits the number of states that can be included in a multi-state flash EEPROM system since the total available voltage range is limited.

It is a general object of the present invention to provide flash EEPROM structures and operating techniques that improve the accuracy of data stored in and read from the memory, particularly when operating in a multi-state mode.

It is a more specific object of the present invention to shrink the size of a flash EEPROM array of cells on an integrated circuit chip without adversely affecting the ability to accurately program and read the memory, particularly when operating in a multi-state mode.

SUMMARY OF THE INVENTION

These and additional objects are accomplished by the present invention, wherein, briefly and generally, techniques are provided for dealing with the potential of increased errors that can result from shrinking the array to position the gates of adjacent cells closer to each other with less dielectric between them. Observed errors in the operation of a shrunk structure would typically be thought to be due to disturbs, wherein the charge level stored on the floating gate is inadvertently changed during normal operation of the memory. The usual remedy for disturbs is to provide a sufficient increased margin within each of the voltage ranges that defines the multiple voltage states. However, it has been discovered as part of the present invention that resulting observed errors are not predominantly due to disturbs but rather are primarily due to the influence of an electric field from adjacent floating gates upon the apparent voltage level of the floating gate of a cell being read. That is, the voltage from the charge stored on an adjacent floating gate is partially coupled to the floating gate of the cell being read. The state of a cell is thus read from a combination of the charge on its floating gate and voltages partially coupled from surrounding floating gates. When a cell is written to one state and then one or more surrounding cells is thereafter changed in state, the state then read from the original cell may be different than that originally verified to have been written. This is a much different phenomenon from that occurring with disturbs, wherein the amount of charge on floating gates changes.

The remedy for this undesired charge coupling also differs considerably from that of disturbs. Although the error rate can be reduced by increasing the margin of the defined voltage states, as with disturbs, it has been found that this need not be done. Rather, either structural changes are made to the cell to reduce the electric field coupling between adjacent cell floating gates, the effect of the voltage of adjacent cells is taken into account during reads, or a combination of both is used. A correct diagnosis of the cause of increased errors with increased cell density has resulted in the data storage capacity possible from a given integrated circuit area to be maximized. The advantage of an increased cell density is not lost to fewer states being storable on individual cells.

Specific techniques for implementing the various aspects of the present invention, as well as additional objects, advantages and features of the present invention, are provided in the following description of its preferred embodiments, which description should be taken in conjunction with the accompanying drawings.

BRIEF DESCRIPTION OF THE DRAWINGS

FIG. 1 illustrates a non-volatile mass storage memory of a type in which the various aspects of the present invention may be utilized, when connected to a host computer system;

FIG. 2 is a schematic block diagram of the flash memory block of FIG. 1 in which the present invention is implemented;

FIG. 3A is a plan view of a portion of one embodiment of a flash EEPROM array in which the present invention is implemented;

FIG. 3B is a sectional view of the array of FIG. 3A, taken at section 3B—3B thereof;

FIG. 3C is a sectional view of the array of FIG. 3A, taken at section 3C—3C thereof, and showing a first aspect of the invention;

FIG. 3D is a sectional view of the array of FIG. 3A, taken at section 3C—3C thereof, and showing a second aspect of the invention;

FIG. 4 is a schematic equivalent circuit of a representative one of the memory cells of the flash EEPROM array embodiment of FIGS. 3A–D;

FIG. 5 illustrates multi-state operation of the memory cells of the embodiment of FIGS. 3A–D;

FIG. 6 shows a typical distribution of the voltages stored for one state of a cell of the embodiment of FIGS. 3A–D;

FIG. 7 is a sectional view of a portion of a flash EEPROM according to a second embodiment;

FIGS. 8A and 8B illustrate electric field coupling between adjacent floating gates of two different array structures;

FIG. 9 shows steps of operating a flash EEPROM according to another aspect of the present invention; and FIG. 10 illustrates a read breakpoint level adjustment used in the operation illustrated by FIG. 9.

DESCRIPTION OF THE PREFERRED EMBODIMENTS

A mass storage memory system 11 in which the various aspects of the present invention are implemented is shown in FIG. 1 to be connected to a system bus 13 of a host computer. The host computer is shown to include, connected with its bus 13, a central processor 15, some volatile memory 17 and a circuit 19 providing connection with input/output devices or circuits. Such a host system can be a personal computer, a camera, or any other system that requires a mass storage memory system. That memory system 11 functionally includes a block 21 of an array of flash EEPROM cells, with associated decoder and control circuits, and a controller 23 connected with the block 21 by means of an address bus 25, a control status bus 27, two-bit (for example) serial write data lines 29 and two-bit (for example) serial read data lines 31. Both the memory array 21 and controller 23, all of the memory system 11, can be implemented on a single I.C. chip. Alternatively, two or more I.C. chips can be used to form the flash memory 21 with the controller 23 for all the memory chips being included on its own dedicated chip or on one of the multiple memory chips.

The memory system 11 can either be permanently built into the computer of its host equipment or can be packaged into a small card that is removably connected to the host. Prior U.S. Pat. Nos. 5,297,148 and 5,430,859, and pending applications Ser. Nos. 08/527,254 and 08/781,539, provide background and implementation details of such a memory system in which the various aspects of the present invention may be included. These patents and applications are hereby incorporated herein by this reference.

The block 21 of the memory system 11 is shown in FIG. 2. An array 33 of EEPROM cells is organized into rows and columns. A decoder 35 selects one or more of row (word) lines 37 designated by a portion of an address on the memory system address bus 25. Similarly, a decoder 39 selects one or more of column lines 41 in response to another portion of an address on the address bus 25. The selected row and column lines are energized to specific sets of voltages for reading, programming or erasing the memory cells that are so addressed. These voltages are applied through the row and column address decoders 35 and 39. An example of the memory cell array is described in the patents identified above as Background, wherein the row lines are connected to the control gates of a row of memory cells and the column lines are source/drain diffusions. For programming and reading, a single row line and a number of column lines are simultaneously selected by the decoders 35 and 39 for programming or reading a number of cells in parallel.

During programming, the voltages of the selected column lines are set by a chunk of incoming data that is received by data register 43 and temporarily stored in write buffers 45. During reading, currents passing through addressed cells and their column lines are compared in a read buffer circuit 47 with currents in lines 50 that are passed through programmed reference cells 49, the results of that comparison providing the states of the addressed cells that are applied to the data register 43 in a manner to output the read data in lines 31. The program, read and erase operations are controlled by control logic 51 in response to signals on the control/status bus 27. The control logic 51 also receives a signal in a line 53 from the data register 43 that indicates when it has been verified that all bits of a chunk of data have been successfully programmed.

The cell array 33 is typically divided into blocks or sectors of cells that are addressable together for simultaneous erasure. According to one implementation, each block also typically includes enough cells to store the same number of bytes of user data as a standard disk drive sector, namely 512 bytes, but may be some other size. Each block also includes an additional number of cells to store overhead information related to the block or the user data stored in it, and optionally spare cells, a total of 32 bytes in one implementation. The overhead information is similar to a header to a disk drive data sector.

With reference to FIGS. 3A–D, an existing integrated circuit structure is described in which certain aspects of the present invention are implemented. An array of non-volatile cells includes floating gates 61–77 arranged in rows and columns between source and drain implants 78–81 in a semiconductor substrate 60. Each row of floating gates has one of control gates 82–85 extending there along. Between every other row, one of the erase gates 86 and 87 extends along the length of the row. Each of the gates is formed of conductively doped polysilicon. Dielectric layers between the gates and substrate have been omitted for clarity.

An electrical equivalent circuit of the memory cell including the floating gate 71 is given in FIG. 4, wherein common elements with the structure of FIGS. 3A–D are identified by the same reference character with a prime (') added. Each of the cells in this example are of a split gate type. The control gate 84 has a surface 95 opposite to and coupled with the floating gate 71, as well as another surface 97 opposite to and coupled with a surface 93 of the substrate 60. This forms a cell with two transistors in series, one including both the control gate portion 95 and the floating gate 71 that controls conduction in a portion 91 of a channel between source and drain implants 79 and 80, and the other transistor controlling conduction in another portion 93 of the substrate channel by a portion 97 of the control gate. A surface 99 of the erase gate 87 is coupled with an edge of the floating gate 71 through a tunnel dielectric. Although the present invention is being described with respect to this particular memory structure, the invention also applies to other types of flash EEPROM cell arrays such as those not using the split-gate cell and those which erase to the substrate and omit the separate erase gate. Further, although the array of FIGS. 3 and 4 is of a NOR type, the present invention also applies to arrays of the NAND type.

FIG. 5 illustrates multi-state operation of each of the cells of the array, wherein four levels are provided with breakpoints 101, 103 and 105 between them. The voltage of the cell floating gate is indicated on the left, having a programmable window within a range of zero to about 10.0 volts, for example. This window is divided into ranges 107, 109, 111 and 113 which define the respective four states 0–3, with margins being provided between these ranges and their boundary defining breakpoint levels. For example, when programmed into state 1, the voltage of a floating gate of the cell is adjusted to within the range 109 with regions 115 and 117 on either side as margins.

As illustrated in FIG. 6, it is desired that the voltages on floating gates of a population of cells programmed into one of the states be very narrow such, as indicated by a distribution curve 119. When the distribution widens from the effects of disturbs, such as indicated by the dashed and dotted curves of FIG. 6, the margins 115 and 117 must be increased further in order to avoid errors. This then reduces the number of states into which the cells may be programmed within the available voltage window. Although only four states are illustrated in FIG. 5, eight or more states are contemplated, which makes it more important to maintain the distribution 119 as narrow as possible. The use of four states stores two bits of data per cell, while the use of eight states allows each cell to store three bits of data.

As is well known, the amount of charge on the floating gate of a cell controls the conduction through the cell. A common technique for reading its state includes applying a given voltage across its source and drain, holding its control gate at a fixed voltage, and then reading the programmed state from the level of current that flows through the cell. The read current level is indicated on a scale on the right side of FIG. 5 but is not necessarily linear with the floating gate charge voltage level scale on the left of FIG. 5 because the cell transistor may not be operating in its linear region. The read current values of breakpoint levels 101, 103 and 105 are preferably established by reference cells 49 (FIG. 2). The current of each cell being read is compared to those breakpoint levels to determine the state of the cell. This read is also performed during programming to verify when each cell has been programmed into its desired state.

As an alternative to reading the state of a cell in this way, the voltage on the cell's control gate is incremented in small steps or continuously ramped and, with a given voltage across its source and drain, the current flowing through the cell is more simply monitored. The voltage on the control gate when the current through the cell reaches a predetermined level is indicative of the state of the cell. Adjacent ranges of control gate voltage define the multiple states of the cells. This and other read techniques are described in a copending patent application entitled "Novel Multi-State Memory," Ser. No. 08/910,947, filed Aug. 7, 1997,which application is incorporated herein by this reference. The techniques of the present invention may also be implemented in a memory system that employs this alternative read technique.

Improved Cell Array Structure

When the scale of the memory structure of FIGS. 3A–D is reduced in a manner that positions the gates of adjacent cells closer together, a widening of the distribution 119 has resulted. A natural response to this observation is to increase the magnitude of the margins 115 and 117 in order to avoid data errors, in the same manner as done to compensate for disturbs. But this then limits the number of states into which the individual cells may be programmed within a fixed voltage window that exists for their operation. Fortunately, it has been found that a cause of the widening distribution is not an increased spread of the amount of charge programmed onto the floating gate but rather is due to the existence of an electric field resulting from the charge on adjacent floating gates, which are now closer together than before. An electric field coupled from adjacent floating gates to the floating gate of a cell being read affects the apparent voltage read from that cell. A difficulty is that surrounding cells can be either programmed or erased, and can be programmed into different states, at a time after the present cell now being read was programmed. Knowing this allows other techniques to be used to avoid data read errors, without having to increase margins and, as a result, without having to reduce the number of states to which each cell can be programmed.

These other techniques include adding elements to the structure of the array that significantly reduce the amount of electric field coupling between floating gates of adjacent cells. In an embodiment of FIG. 3C, a conductive shield 88 is positioned between adjacent rows of floating gates that include gates 66 and 71. This shield is normally connected to ground potential but some other potential could be used. In the particular structure illustrated in FIGS. 3A–C, only the spaces between the floating gates of every other row require such a shield to be added. Between alternate rows of cells are erase gates, such as gates 86 and 87, which serve to shield the floating gates on opposite sides of the erase gates from each other. In the other direction, along the rows (or between columns of cells), the control gates provide this shield. This is best illustrated by FIG. 3B, where the control gate 84 is formed in between adjacent ones of the floating gates 69, 71, 72 and 73.

As an alternative to interposing a conductive shield between adjacent floating gates, with reference to FIG. 3D, a strip of dielectric material 89 may be used instead, wherein its dielectric constant is quite low. The dielectric constant of silicon dioxide, the usual dielectric material that is employed between the gates, has a dielectric constant of about 4. Silicon nitride, also used for some dielectrics along with or in place of silicon dioxide, has a dielectric constant of about 7.5. The degree of coupling between adjacent floating gates is increased as the dielectric constant of the insulator between them increases. Conversely, choosing a material having a dielectric constant less than that of dielectrics now used decreases the coupling and the distribution spread 119 (FIG. 6). Rather than using materials with a dielectric constant k in excess of 3.8 entirely between adjacent unshielded floating gates, as now commonly done, a portion or all of the distance between gates is formed of a material having a dielectric constant of less than 3.8, 3.0, 2.5 or even 2.0, but, or course, not less than 1.0. Various materials having such low dielectric constants, both solids and non-solids, are described in the literature for use as integrated circuit dielectrics.

Referring to FIG. 7, an example of the use of these floating gate isolation techniques is given in a flash EEPROM structure that is different from that illustrated in FIGS. 3A–D. Rows of floating gates extend into the page, each of floating gates 121–126 being in a separate row. Control gates 127–132 are positioned over the respective rows and extend as continuous strips into the page. Pairs of the rows share an elongated source implant in a substrate 133, such as the rows including the floating gates 121 and 122 sharing a source 135. Drain implants, such as a drain 137, extend along opposite sides of the floating gates. The drain implants are contacted through a metal line 139. Strips 141, 143 and 145 are positioned between adjacent rows of floating gates, according to the present invention, in order to decouple the adjacent gates. These strips may be a conductive material or low dielectric constant insulator, in the manner discussed above. It will be noted that the memory of FIG. 7 has a single transistor per memory cell formed of one floating gate, no erase gate and is a NOR "stack gate" type. An example of a self-aligned process for making such an array with very dense cells is given in U.S. Pat. No. 5,120,671.

Improved Read and Programming Algorithms

Instead of physically isolating adjacent floating gates from one another, compensation for the electric field coupling between them can be made when their states are read. To illustrate, an array of floating gates of FIG. 8A is assumed to have no shield between them. Rather, each floating gate is field coupled to some extent with each of several adjacent floating gates. For example, a gate 151 is surrounded by eight other gates 152–159 to which it is coupled to some degree. The gate 151 is shown to have a 10% (0.1) coupling, for example, with each of the closest gates 152, 154 and 156. This means that 10% of the voltage of each of the gates 152, 154 and 156 is coupled to the gate 151. Similarly, a lesser proportion of the voltage on the floating gates further removed from the gate 151 is coupled with it. As a result, reading the state of the cell including the floating gate 151 is most likely to be in error. But this reading is correctable, according to another aspect of the present invention, by also reading the states of all the cells field coupled with the cell being read.

However, there are usually not so many interactions between floating gates in actual memory structures, so compensation for the effects of surrounding floating gate charge levels as part of the read algorithm can be implemented with greater speed. Such an example is given in FIG. 8B, wherein the same array of floating gates shown in FIG. 8A has elongated conductive shields 161–165 added. These shields could be erase, control or other operating gates, for example. The gate 151 is now influenced by the charge on only the two floating gates positioned on its opposite sides. In the case of the memory array structure of FIGS. 3A–C without the added conductive shield 88, each floating gate is strongly coupled with only one other floating gate, making compensation even simpler.

A read of a cell is compensated by first reading the states of all the cells that are field coupled with the cell being read. A number related to either the floating gate voltage or the state of each coupled cell is then multiplied by the coupling ratio between the cells. For example, with respect to reading the cell including the floating gate 151 of FIG. 8A, this number for the gate 153 is multiplied by 0.04, the number for the gate 154 multiplied by 0.1, and so forth. A sum of these resulting quantities is then used to compensate for their effect upon the apparent voltage of the floating gate 151.

It may appear at first that this compensated read technique would not work satisfactorily because the reads of the states of the adjacent cells are also subject to the same error as a result of cells adjacent to them. That is, it would seem that reads of adjacent cells are erroneous because they are field coupled to at least the cell being read and possibly other surrounding cells. It is true that the states of the adjacent cells are read with this error since it is done without compensation. But since only a small proportion of the voltage level stored in the adjacent cells is coupled to the cell being read, only a small proportion of any error in the reading of the adjacent cells affects the state read from the cell in question. For example, only 10% of the charge on the gate 152 (FIG. 8A or 8B) is shown to be coupled with the cell 151 being read. Therefore, only 10% of the error in reading the adjacent cell, in this example, is included in the result. This still reduces by a significant amount the uncertainty of the result of reading the voltage of the floating gate 151, and thus the potential error in such readings.

A preferred compensated read technique is illustrated in FIGS. 9 and 10. A first step 171 indicates that an address of a group of cells to be read in parallel, in this case an entire row, is first received from the controller 23 (FIG. 1). In a next step 173, adjacent cells that are field coupled with those of the addressed row are identified and their states read with the standard breakpoint levels 101, 103 and 105 (FIG. 10). These readings are then multiplied by the coupling ratio between each of the adjacent cells and the cells of the addressed row being read, as part of a step 175. These multiplied readings are then combined, also as part of the step 175, in order to determine the collective effect of the adjacent cells on each of the cells of the addressed row being read.

A next step 177 adjusts the breakpoint levels between states for each of the cells of the addressed row. This is illustrated by FIG. 10. The threshold current breakpoint levels 101, 103 and 105 are shifted for each of the addressed cells to respective levels 101', 103' and 105' by an amount that compensates for the voltage coupled from adjacent cells. The current read from the cell is then compared with the adjusted current breakpoint levels in order to accurately read its state, as indicated by a step 179.

If the alternative read technique is used, wherein the control gate voltage is incremented in small steps until the cell current reaches a single defined level, breakpoint levels of control gate voltage that defined the multiple states of a cell are shifted in a similar manner.

The same compensating technique is used as part of the programming process when the states of the cells being programmed are individually read in order to verify that they have been programmed to the desired states.

A disadvantage of this compensation technique is that it can increase the time necessary to read and to program each row of cells because adjacent rows also need to be read as part of the process. But this can be reduced by reading each row of a sector in order. When a given row is to be read, therefore, the states of one of two adjacent rows have already been determined. If the cells of the row being read are field coupled with cells of the rows on both of its sides, only the cells in the row on its other side need to additionally be read in order to provide all the data necessary for providing the compensation. Further, a combination of the physical gate uncoupling techniques described earlier and a specific order of reading groups of cells within a sector can overcome this disadvantage.

Although the various aspects of the present invention have been described with respect to their preferred embodiments, it will be understood that the invention is entitled to full protection within the scope of the appended claims.

It is claimed:
1. A flash EEPROM, comprising:
an array of memory cells that individually include a source and drain bounding a semi-conductive channel in a substrate, a floating gate positioned adjacent the substrate surface channel with a first dielectric layer therebetween, and one or more operating gates adjacent the floating gate with a corresponding one or more dielectric layers therebetween,
a source of controllable voltages connected to the one or more operating gates, the source and the drain, sensing circuits connectable to the array to determine a quantity related to one of two or more adjacent programmable floating gate charge level ranges defining respective two or more states into which addressed ones of the individual cells are programmed, adjacent floating gates being positioned close enough together such that a change of charge level between one of the two or more charge level ranges on one of two adjacent cells would cause an erroneous reading of at least one of the states of the other of the two adjacent cells if an insulating material having a dielectric constant in excess of 3.8 extended entirely between the adjacent floating gates, and elements positioned between said adjacent floating gates to reduce cross-talk therebetween in order to reduce the erroneous readings.

2. The flash EEPROM of claim 1, wherein said elements positioned between said adjacent floating gates are electrically conductive and positioned to provide an electric field shield between the adjacent floating gates.

3. The flash EEPROM of claim 2, wherein the conductive elements are other than the one or more operating gates.

4. The flash EEPROM of claim 1, wherein said elements are a dielectric material having a dielectric constant of less than 2.5 in order to reduce an electric field coupling between the adjacent floating gates.

5. The flash EEPROM of any one of claims 1–4, wherein said one or more operating gates includes only a control gate.

6. The flash EEPROM of any one of claims 1–4, wherein said one or more operating gates includes only a control gate and an erase gate.

7. The flash EEPROM of any one of claims 1–4, wherein the sensing circuits determine a quantity related to one of three or more adjacent programmable floating gate charge level ranges defining respective three or more states.

8. The flash EEPROM of claim 7, wherein said one or more operating gates includes only a control gate.

9. The flash EEPROM of claim 7, wherein said one or more operating gates includes only a control gate and an erase gate.

10. The flash EEPROM of any one of claims 1–4, wherein the sensing circuits determine a quantity related to one of eight or more adjacent programmable floating gate charge level ranges defining respective three or more states.

11. A flash EEPROM, comprising:

an array of rows and columns of memory cells that individually include a source and drain bounding a semi-conductive channel in a surface of a substrate, a floating gate positioned adjacent the substrate surface channel with a first dielectric layer therebetween, and one or more operating gates adjacent the floating gate with a corresponding one or more dielectric layers therebetween, a source of controllable voltages connected to the one or more operating gates, the source, the drain, and the substrate, the one or more operating gates providing a shield between adjacent floating gates in a direction of one of the rows or columns, sensing circuits connectable to the array to determine a quantity related to one of three or more adjacent programmable floating gate charge level ranges defining respective three or more states into which addressed ones of the individual cells are programmed, adjacent floating gates being positioned close enough together in a direction of the other of the rows or columns such that a change in charge level within one of the three or more charge level ranges on one of two adjacent cells would cause an erroneous reading of at least one of the states of the other of the two adjacent cells if no shield is provided therebetween, and conductive elements other than the one or more operating gates positioned in between the floating gates in a direction of the other of the rows or columns, thereby to provide a shield that substantially eliminates an erroneous reading of the states of adjacent cells.

12. The flash EEPROM of claim 11, wherein said one or more operating gates includes only a control gate.

13. The flash EEPROM of claim 11, wherein said one or more operating gates includes only a control gate and an erase gate.

14. The flash EEPROM of any one of claims 11–13, wherein the sensing circuits determine a quantity related to one of eight or more adjacent programmable floating gate charge level ranges defining respective three or more states.

15. A flash EEPROM, comprising:

an array of rows and columns of memory cells that individually include a source and drain bounding a semi-conductive channel in a surface of a substrate, a floating gate positioned adjacent the substrate surface channel with a first dielectric layer therebetween, and one or more operating gates adjacent the floating gate with a corresponding one or more dielectric layers therebetween, a source of controllable voltages connected to the one or more operating gates, the source, the drain and the substrate, the one or more operating gates providing a shield between adjacent floating gates in a direction of one of the rows or columns, sensing circuits connectable to the array to determine a quantity related to one of three or more adjacent programmable floating gate charge level ranges defining respective three or more states into which addressed ones of the individual cells are programmed, adjacent floating gates being positioned close enough together in a direction of the other of the rows or columns such that a change in charge level within one of the three or more charge level ranges on one of two adjacent cells would cause an erroneous reading of at least one of the states of the other of the two adjacent cells if an insulating material having a dielectric constant in excess of 3.8 extended entirely between the adjacent floating gates, and at least a portion of a distance between the adjacent floating gates in a direction of the other of the rows or columns including a dielectric material having a dielectric constant of less than 3.5, thereby to reduce an electric field coupling between the adjacent floating gates that substantially eliminates an erroneous reading of the states of adjacent cells.

16. The flash EEPROM of claim 15, wherein said one or more operating gates includes only a control gate.

17. The flash EEPROM of claim 15, wherein said one or more operating gates includes only a control gate and an erase gate.

18. The method of claim 15, wherein the dielectric material positioned between the adjacent floating gates has a dielectric constant of less than 2.5.

19. The flash EEPROM of any one of claims 15–18, wherein the sensing circuits determine a quantity related to one of eight or more adjacent programmable floating gate charge level ranges defining respective three or more states.

20. In a flash EEPROM system that includes an array of rows and columns of memory cells that individually have a floating gate and one or more operating gates adjacent the floating gate, and a circuit that reads the states of an addressed plurality of the array of cells with respect to two or more breakpoint levels defining three or more memory states of the individual cells, a method of reading the states of an addressed set of the cells, comprising:

reading the states of a plurality of cells adjacent to and in electric field communication with the addressed set of cells, determining an effect of charge levels on the floating gates of said adjacent cells upon the states read from the addressed set of cells, and adjusting the read states of the addressed set of cells to take into account the effect of charge levels on the floating gates of the adjacent cells.

21. The method of claim 20, wherein adjusting the read states of the addressed set of cells includes shifting the breakpoint levels of the circuit that reads the states of the addressed plurality of cells.

22. The method of claim 21, wherein determining an effect of charge levels on the floating gates of the adjacent cells upon the states read from the addressed set of cells includes:

reading the states of the adjacent cells with reference breakpoint levels in the circuit that reads the states of addressed cells, and utilizing an electric field coupling ratio between individual ones of the addressed and adjacent plurality of cells to determine a proportion of charge on the adjacent cells that is reflected into the readings of the addressed set of cells.

23. The method of claim 20 accomplished a plurality of times during programming of the addressed set of cells to verify their newly programmed states.

* * * * *